(12) United States Patent
Tatani

(10) Patent No.: US 7,714,916 B2
(45) Date of Patent: May 11, 2010

(54) SOLID-STATE IMAGING DEVICE

(75) Inventor: Keiji Tatani, Kanagawa (JP)

(73) Assignee: Sony Corporation, Tokyo (JP)

( * ) Notice: Subject to any disclaimer, the term of this patent is extended or adjusted under 35 U.S.C. 154(b) by 906 days.

(21) Appl. No.: 10/953,098

(22) Filed: Sep. 29, 2004

(65) Prior Publication Data

US 2005/0117039 A1  Jun. 2, 2005

(30) Foreign Application Priority Data

Oct. 1, 2003 (JP) ............................. 2003-343095

(51) Int. Cl.
*H04N 5/335* (2006.01)
*H04N 3/14* (2006.01)

(52) U.S. Cl. ................ 348/273; 348/272; 348/275; 348/277

(58) Field of Classification Search ................ 348/272, 348/294, 273, 277, 275, 280, 282, 281
See application file for complete search history.

(56) References Cited

U.S. PATENT DOCUMENTS

| | | | | |
|---|---|---|---|---|
| 4,553,159 A * | 11/1985 | Moraillon | .................... | 348/280 |
| 5,111,264 A | 5/1992 | Hoshi | | |
| 5,119,180 A * | 6/1992 | Okamoto | .................... | 348/296 |
| 5,251,019 A * | 10/1993 | Moorman et al. | ........... | 348/275 |
| 5,805,217 A * | 9/1998 | Lu et al. | .................... | 348/273 |
| 6,046,772 A * | 4/2000 | Howell | .................... | 348/273 |
| 6,522,356 B1 * | 2/2003 | Watanabe | .................... | 348/272 |
| 6,690,421 B1 * | 2/2004 | Yamada et al. | ............. | 348/272 |
| 6,757,015 B2 * | 6/2004 | Inokuma et al. | ............. | 348/273 |
| 6,822,682 B1 | 11/2004 | Kawajirl et al. | | |
| 6,882,364 B1 * | 4/2005 | Inuiya et al. | ................. | 348/252 |
| 7,019,774 B2 * | 3/2006 | Kuno et al. | ............... | 348/219.1 |
| 7,110,031 B2 * | 9/2006 | Kondo et al. | ................. | 348/315 |
| 7,214,998 B2 * | 5/2007 | Wu et al. | .................... | 257/440 |
| 7,218,348 B2 * | 5/2007 | Misawa | ....................... | 348/275 |
| 7,336,306 B2 * | 2/2008 | Oda | ............................ | 348/272 |
| 2002/0093579 A1 * | 7/2002 | Abe | ............................ | 348/253 |
| 2002/0140831 A1 * | 10/2002 | Hayashi | ....................... | 348/272 |
| 2002/0180877 A1 * | 12/2002 | Kikuchi | ....................... | 348/315 |
| 2003/0011693 A1 * | 1/2003 | Oda | ............................ | 348/272 |
| 2003/0067550 A1 * | 4/2003 | Inokuma et al. | ............. | 348/322 |
| 2004/0100570 A1 * | 5/2004 | Shizukuishi | ................ | 348/272 |

FOREIGN PATENT DOCUMENTS

| | | |
|---|---|---|
| JP | 55-013578 | 1/1980 |
| JP | 60-093893 | 5/1985 |
| JP | 61-101185 | 5/1986 |
| JP | 62-014601 | 1/1987 |
| JP | 62-042690 | 2/1987 |
| JP | 64-010659 | 1/1989 |
| JP | 10-262260 | 9/1998 |
| JP | 2001-057420 | 2/2001 |
| JP | 2003-230158 | 8/2003 |

* cited by examiner

*Primary Examiner*—Tuan Ho
*Assistant Examiner*—Marly Camargo
(74) *Attorney, Agent, or Firm*—Robert J. Depke; Rockey, Depke & Lyons, LLC

(57) ABSTRACT

In a solid-state imaging device, a primary color Bayer color filter is provided on an imaging pixel area defined by pixels having different structures. Color-component filters for the same color in the color filter are disposed correspondingly to pixels having the same structure. More specifically, pixels are arranged in consideration of the arrangement of color-component filters of the color filter, or the color-component filters are arranged in consideration of the arrangement of the pixels.

5 Claims, 8 Drawing Sheets

FIG. 6A
(PRIOR ART)
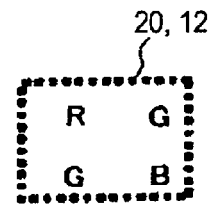
FIG. 6B
(PRIOR ART)
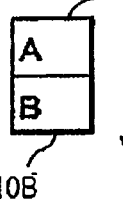
FIG. 6C
(PRIOR ART)

SOLID-STATE IMAGING DEVICE

BACKGROUND OF THE INVENTION

1. Field of the Invention

The present invention relates to a solid-state imaging device, such as a CCD image sensor or a CMOS image sensor, including an imaging pixel area defined by two-dimensionally arranged pixels, and color filters.

2. Description of the Related Art

Conventionally, solid-state imaging devices, such as CCD image sensors and CMOS image sensors, are known as miniature cameras to be mounted in digital cameras and portable telephones. Solid-state imaging devices include an imaging pixel area in which multiple pixels, each having a photoelectric conversion region such as a photodiode, are two-dimensionally arranged in rows and columns. Imaging light is converted into signal charges by the pixels, and the signal charges are converted into electrical signals to obtain image signals corresponding to a two-dimensional image.

In CCD image sensors, signal charges obtained by photodiodes in pixels are transferred to an output unit by a CCD transfer register, and are output after being converted into electrical signals in a lump. In CMOS image sensors, each pixel includes a photodiode and a transistor circuit. A signal charge obtained by the photodiode is converted into an electrical signal by the transistor circuit, and is output through a signal line.

In these solid-state imaging devices, in order to capture a color image, for example, RGB primary color filters are arranged in a mosaic form on an imaging pixel area, a group of adjoining pixels receives light components with wavelengths for R, G, and B, and color image signals are obtained from RGB color-component image signals.

For example, Japanese Unexamined Patent Application Publication No. 2000-201355 discloses a color CCD imaging device using, as a color filter having such a color pattern, a color filter having a so-called primary color Bayer pattern. In the primary color Bayer pattern, one red pixel, one blue pixel, and two green pixels are arranged in a matrix of two by two pixels to define one group.

In the following description, four pixels (one red pixel, one blue pixel, and two green pixels) that define one group are referred to as a base unit.

In the primary color Bayer pattern, two green filters are diagonally disposed in a well-balanced manner in each base unit defined by four pixels. Therefore, this pattern is effective to ensure brightness gradation.

In the above-described solid-state imaging device, when the size of each pixel and the number of transistors in each pixel (in CMOS image sensors) decrease, pixels sometimes have different shapes (structures).

FIG. 6 is a plan view showing the pixel pattern of an imaging pixel area in a known solid-state imaging device having primary color Bayer color filters.

As shown in FIG. 6, multiple pixels 10A and 10B are basically arranged in a matrix of rows and columns. A primary color Bayer RGB color filter 20 is disposed correspondingly to each base unit 12 defined by 2 by 2 pixels. In the figure, base units and color filters are enclosed by boxes shown by broken lines.

Pixels 10A marked with A and pixels 10B marked with B are different in structure. Two pixels 10A having an A-structure are arranged on one side (upper side in the figure) of each base unit 12, and two pixels 10B having a B-structure are arranged on the other side (lower side) thereof.

However, when primary color Bayer color filters are provided in the above-described solid-state imaging device including pixels having different structures, the image quality is sometimes reduced, for example, luminance variations (bands) are found among lines (pixel rows).

It is thought that this is caused by the assignment of pixels having different structures to filters of the same green color in each base unit of the primary color Bayer pattern.

FIGS. 7 and 8 show examples of pixels having different structures. FIG. 7 shows that the positions of readout transistors in pixels are not the same. FIG. 8 shows a case in which the light-receiving areas of photoelectric conversion regions in pixels are not the same.

In FIG. 7, the position of readout transistors (readout gates) 32 for reading charges from photoelectric conversion regions 31 in pixels 30A is different from that in pixels 30B. For this reason, the pixels 30A and the pixels 30B have different light-receiving characteristics with respect to oblique light.

In FIG. 8, the size of photoelectric conversion regions 41 in pixels 40A is different from that in pixels 40B (the positions of readout transistors (readout gates) 42 are the same). In this case, the pixels 40A and the pixels 40B also have different light-receiving characteristics.

SUMMARY OF THE INVENTION

Accordingly, it is an object of the present invention to provide a solid-state imaging device that has an imaging pixel area defined by pixels having different structures, and that ensures high image quality, in spite of miniaturization of pixels, by preventing image quality from being reduced by combinations of color filters of the same color and pixels having different structures.

In order to achieve the above object, according to one aspect, the present invention provides a solid-state imaging device including an imaging pixel area defined by a plurality of two-dimensionally arranged pixels, the pixels including respective photoelectric conversion regions and having different structures, and a color filter including a plurality of color-component filters disposed on the imaging pixel area correspondingly to the respective pixels to supply specific color light components to the photoelectric conversion regions of the pixels. Color-component filters for the same color in the color filter are disposed correspondingly to pixels having the same structure.

According to another aspect, the present invention provides a solid-state imaging device including an imaging pixel area defined by a plurality of two-dimensionally arranged pixels, each of the pixels having a photoelectric conversion region, and a color filter disposed on the pixels. The imaging pixel area includes a plurality of first pixels, and a plurality of second pixels having a structure different from that of the first pixels. Color-component filters for the same color included in the color filter are disposed on the first pixels or the second pixels.

BRIEF DESCRIPTION OF THE DRAWINGS

FIGS. 3A to 3D are plan views showing a pixel pattern of an imaging pixel area in a solid-state imaging device having primary color Bayer color filters according to a third embodiment of the present invention;

FIGS. 4A to 4D are plan views showing a pixel pattern of an imaging pixel area in a solid-state imaging device having primary color Bayer color filters according to a fourth embodiment of the present invention;

FIGS. 6A to 6C are plan views showing a pixel pattern of an imaging pixel area in a known solid-state imaging device having primary color Bayer color filters;

DESCRIPTION OF THE PREFERRED EMBODIMENTS

In a solid-state imaging device of the present invention, when a primary color Bayer color filter is provided for an imaging pixel area defined by pixels having different structures, color-component filters for the same color in the color filter are disposed correspondingly to pixels having the same structure.

More specifically, pixels are arranged in consideration of the arrangement of color-component filters of the color filter, or the color-component filters are arranged in consideration of the arrangement of the pixels.

In the former case, two green-component filters in the color filter are disposed in a first diagonal direction of a base unit defined by four pixels arranged in a matrix of two rows and two columns in the imaging pixel area, and one red-component filter and one blue-component filter are disposed in a second diagonal direction. First pixels assigned to the green-component filters are disposed every other row and every other line in the imaging pixel area so as to always correspond to the green-component filters. This arrangement can be achieved with a known color filter merely by changing the arrangement of the pixels.

In the latter case, first pixels and second pixels having different structures are provided, and pixels having the same structure are successively arranged in the pixel row direction or the pixel column direction. In the color filter, first, one red-component filter and one blue-component filter are placed on two second pixels at the center of a base unit, and two green-component filters are placed on two first pixels that are diagonally disposed, with the two second pixels therebetween. Therefore, the base unit is defined by four pixels arranged in a substantially crank-shaped region, and the two first pixels and the green-component filters are disposed on the diagonal of the base unit. This arrangement can be achieved merely by changing the color filter without changing the arrangement of the pixels.

With the above structures, the color-component filters of the color filter can be arranged in accordance with the structures of the pixels. Consequently, image quality can be prevented from being reduced by combinations of pixels having different structures and color-component filters.

The present invention is similarly applicable to solid-state imaging devices including color filters having patterns other than the primary color Bayer pattern.

First Embodiment

Figure 1A:
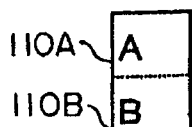
FIGS. 1A to 1C are plan views showing a pixel pattern of an imaging pixel area in a solid-state imaging device having primary color Bayer color filters according to a first embodiment of the present invention.
Figure 1B:
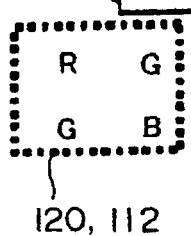
Figure 1C:
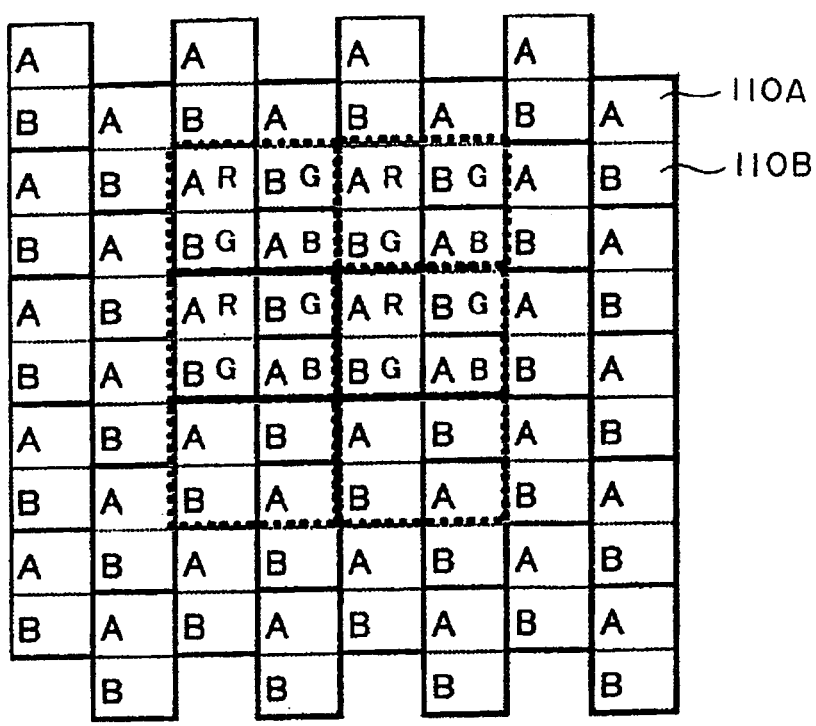

FIGS. 1A to 1C are plan views showing the pixel pattern of an imaging pixel area in a solid-state imaging device having primary color Bayer color filters according to a first embodiment of the present invention.

Referring to FIGS. 1A to 1C, multiple pixels 110A and 110B are arranged in a matrix of rows and columns in the solid-state image sensor of the first embodiment, in a manner similar to that in the known solid-state imaging device shown in FIG. 6. A primary color Bayer color filter 120 is disposed correspondingly to each base unit 112 provided in a rectangular area defined by 2 by 2 pixels. In the figures, base units 112 and color filters 120 are enclosed by a box shown by a broken line.

Unlike the pixel pattern shown in FIG. 6, columns of pixels are alternately shifted by one pixel in the vertical direction (column direction) in the first embodiment. Therefore, as shown in FIG. 1C, pixels having an A-structure (second pixels) 110A and pixels having a B-structure (first pixels) 110B are alternately arranged in both the vertical and horizontal directions.

When the color filters 120 have a pattern of color-component filters similar to that in FIG. 6, two green-component filters in each base unit 112 are disposed correspondingly to two pixels (first pixels) 110B having the B-structure. A red-component filter and a blue-component filter are disposed correspondingly to two pixels (second pixels) 110A having the A-structure.

As a result, it is also possible to place the color-component filters in accordance with the structures of the pixels, and to thereby enhance image quality.

Second Embodiment

Figure 2A:
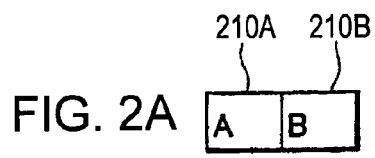
FIGS. 2A to 2C are plan views showing a pixel pattern of an imaging pixel area in a solid-state imaging device having primary-color Bayer color filters according to a second embodiment of the present invention.
Figure 2B:
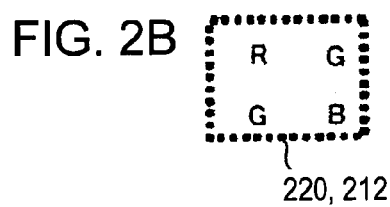
Figure 2C:
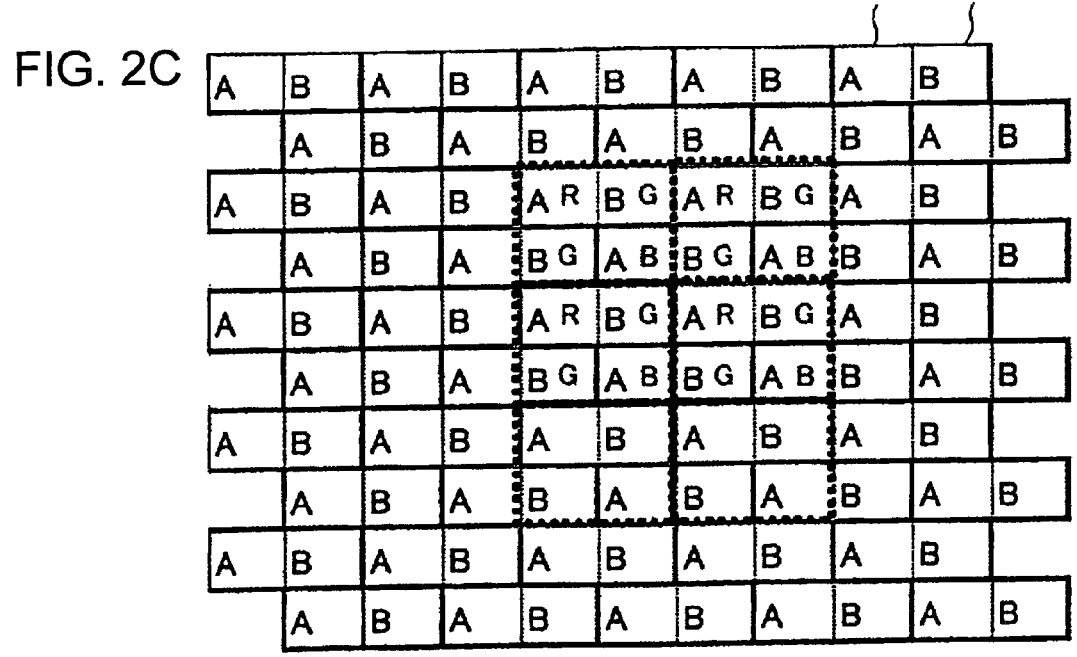

FIGS. 2A to 2C are plan views showing the pixel pattern of an imaging pixel area in a solid-state imaging device having primary color Bayer color filters according to a second embodiment of the present invention.

Referring to FIGS. 2A to 2C, multiple pixels 210A and 210B are arranged in a matrix of rows and columns in the solid-state image sensor of the second embodiment, in a manner similar to that in the first embodiment shown in FIGS. 1A to 1C. A primary color Bayer color filter 220 is disposed correspondingly to each base unit 212 provided in a rectangular area defined by 2 by 2 pixels. In the figures, base units 212 and color filters 220 are enclosed by a box shown by a broken line.

Unlike the pixel pattern shown in FIG. 6, rows of pixels are alternately shifted by one pixel in the horizontal direction (row direction) in the second embodiment. Therefore, as shown in FIG. 2C, pixels having an A-structure (second pixels) 210A and pixels having a B-structure (first pixels) 210B are alternately arranged in both the vertical and horizontal directions.

When the color filters 220 have a pattern of color-component filters similar to that in FIG. 6, two green-component filters in each base unit 212 are disposed correspondingly to two pixels (first pixels) 210B having the B-structure. A red-component filter and a blue-component filter are disposed correspondingly to two pixels (second pixels) 110A having the A-structure as in FIG. 6.

As a result, it is possible to place the color-component filters in accordance with the structures of the pixels, and to thereby enhance image quality.

Third Embodiment

FIGS. 3A to 3D are plan views showing the pixel pattern of an imaging pixel area of a solid-state imaging device having primary color Bayer color filters according to a third embodiment of the present invention.

Referring to FIGS. 3A to 3D, in the solid-state imaging device of the third embodiment, rows of pixels (second pixels) 310A having an A-structure and rows of pixels (first pixels) 310B having a B-structure are alternately arranged, in a manner similar to that in the known solid-state imaging device shown in FIG. 6. However, the structures of a base unit and a color filter are different from those in FIG. 6.

In the third embodiment, a red-component filter and a blue-component filter adjoin at the center of each base unit 312 correspondingly to two pixels (second pixels) 310A having the A-structure and adjoining in the horizontal direction (row direction). Two green-component filters are disposed on two pixels (first pixels) 310B having the B-structure and provided so as to diagonally oppose each other with the two second pixels 310A therebetween. That is, in the base unit 312, one of the first pixels 310B adjoins one side (lower side) in the column direction of one (left one) of the second pixels 310A. The other first pixel 310B adjoins the other side (upper side) in the column direction of the other second pixel 310A (right one).

Therefore, the base unit 312 is defined by four pixels 310A and 310B arranged in a substantially crank-shaped area. The two first pixels 310B and the two green-component filters are disposed on the diagonal of the base unit 312.

In the third embodiment, it is also possible to place the color-component filters in accordance with the structures of the pixels, and to thereby enhance image quality.

Figure 3A:
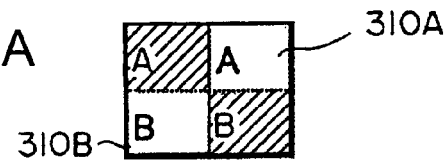
Figure 3B:
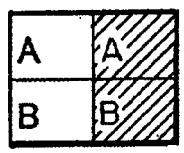
Figure 3C:
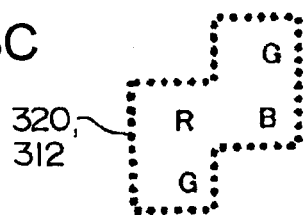

FIGS. 3A and 3B show methods for combining the pixels 310A and 310B having different structures into a base unit. The pixels 310A and 310B having different structures may be diagonally arranged, as shown in FIG. 3A, or may vertically adjoin, as shown in FIG. 3B. Although the pixels 310A and 310B vertically adjoin and the green-component filters are arranged correspondingly thereto in FIGS. 3C and 3D, they may be arranged diagonally.

Fourth Embodiment

FIGS. 4A to 4D are plan views showing the pixel pattern of an imaging pixel area in a solid-state imaging device having primary color Bayer color filters according to a fourth embodiment of the present invention.

In the solid-state imaging device of the fourth embodiment, columns of pixels (second pixels) 410A having an A-structure and columns of pixels (first pixels) 410B having a B-structure are alternately arranged, as shown in the figures. The structures of a base unit 412 and a color filter 420 are different from those in the above third embodiment.

A red-component filter and a blue-component filter adjoin at the center of each base unit 412 correspondingly to two pixels (second pixels) 410A having the A-structure and adjoining in the vertical direction (column direction). Two green-component filters are disposed on two pixels (first pixels) 410B having the B-structure and provided so as to diagonally oppose each other with the two second pixels 410A therebetween. That is, in the base unit 412, one of the first pixels 410B adjoins one side (left side) in the row direction of one (upper one) of the second pixels 410A. The other first pixel 410B adjoins the other side (right side) in the row direction of the other second pixel (lower pixel) 410A.

Therefore, the base unit 412 is defined by four pixels 410A and 410B arranged in a substantially crank-shaped area. The two first pixels 310B and the two green-component filters are disposed on the diagonal of the base unit 412.

In the fourth embodiment, it is also possible to place the color-component filters in accordance with the structures of the pixels, and to thereby enhance image quality.

Figure 4A:
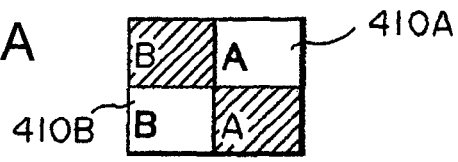
Figure 4B:
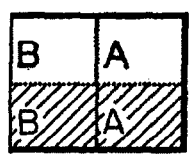
Figure 4C:
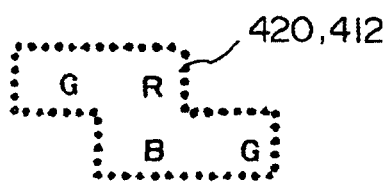

FIGS. 4A and 4B show methods for combining the pixels 410A and 410B having different structures into a base unit. The pixels 310A and 310B having different structures may be diagonally arranged, as shown in FIG. 4A, or may horizontally adjoin, as shown in FIG. 4B. Although the pixels 410A and 410B horizontally adjoin and the green-component filters are arranged correspondingly thereto in FIGS. 4C and 4D, they may be arranged diagonally.

Figure 5:
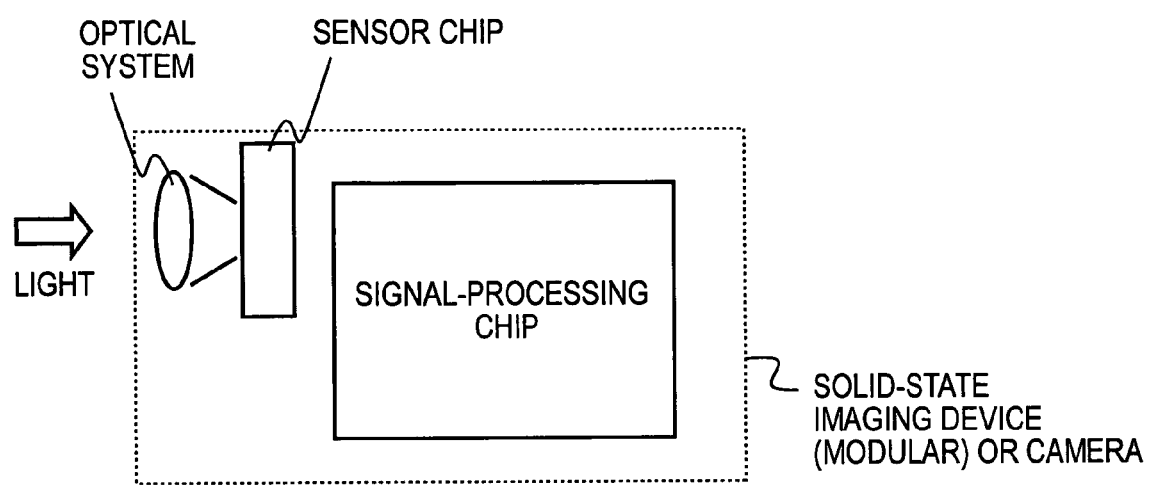
FIG. 5 is a structural view of a solid-state imaging device (modular type) or a camera to which the present invention is applied.
Figure 7:
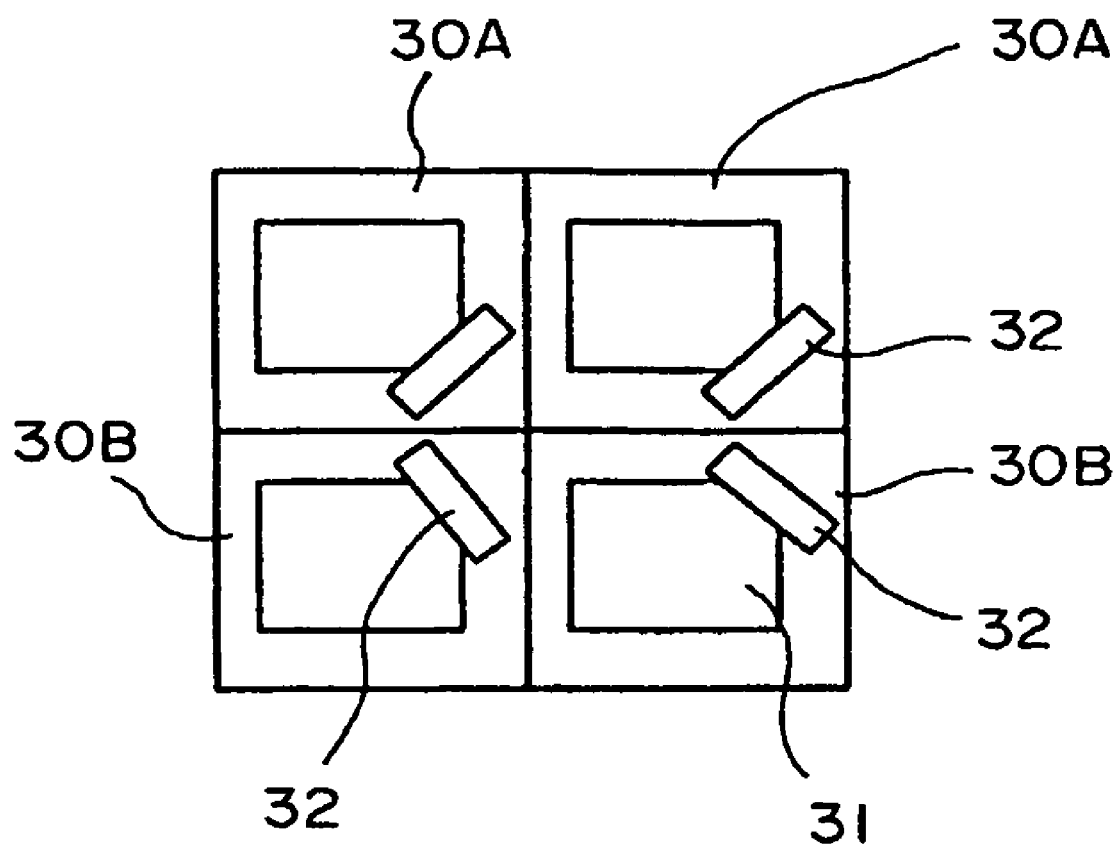
FIG. 7 is a plan view showing a case in which the position of a readout transistor varies from pixel to pixel.
Figure 8:
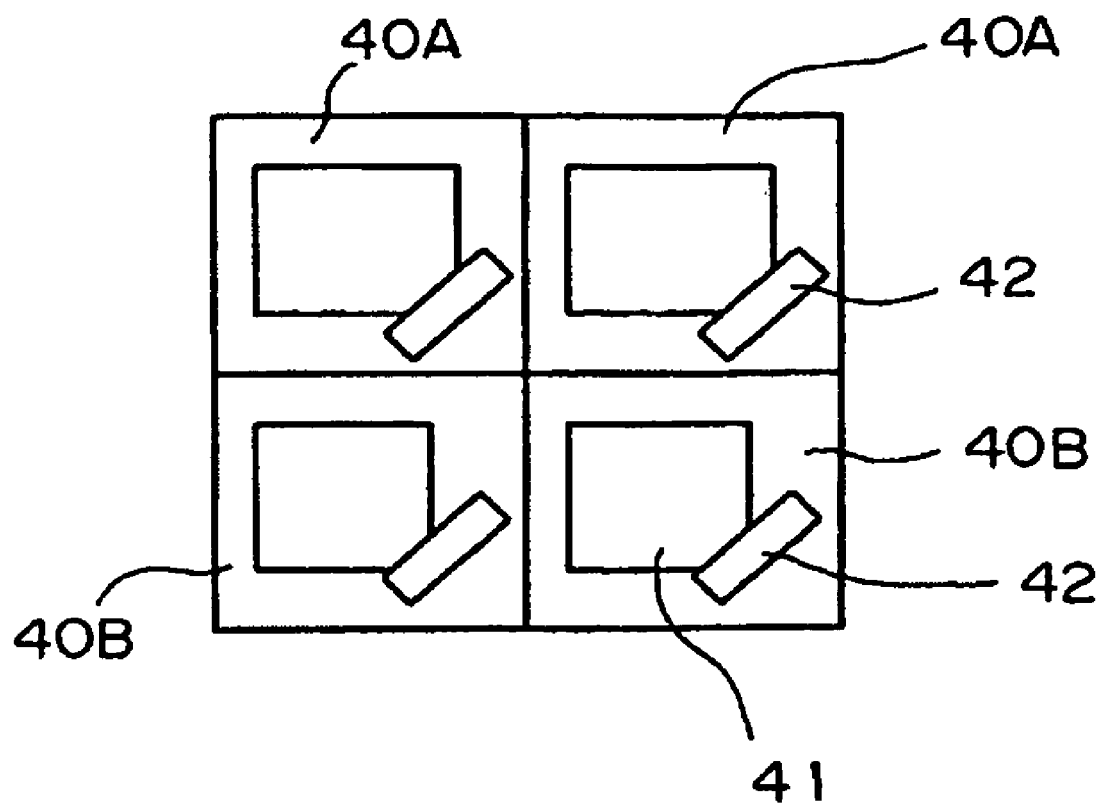
FIG. 8 is a plan view showing a case in which the light-receiving area of a photoelectric conversion region varies from pixel to pixel.

The solid-state imaging device of the present invention may be formed in one chip or in a module serving as an assembly of a plurality of chips. When the solid-state imaging device is provided as an assembly of a plurality of chips, it includes, for example, a sensor chip for image capturing and a signal-processing chip for digital signal processing, and sometimes further includes an optical system, as shown in FIG. 5.

In the above-described embodiments of the present invention, the terms "row" and "column" indicating the arrangement of pixels and the directions of lines refer, respectively, to the horizontal direction and the vertical directions of a matrix. However, the present invention is not limited to this arrangement of the components. For example, signals may be read from pixels into the outside of the imaging pixel area through signal lines disposed in the horizontal directions. The directions indicated by the terms "row" and "column" depend on the definitions thereof. Therefore, for example, when "row" indicates the vertical direction, "row" and "column" may be interpreted oppositely in the present invention.

Even when pixels are not arranged in a precise matrix, for example, even when lines of pixels are alternately shifted by a half pixel in the horizontal or vertical direction, the directions of "row" and "column" may be interpreted appropriately.

As described above, in the solid-state imaging device of the present invention, color-component filters for the same color in the color filters are disposed correspondingly to pixels having the same structure. Therefore, when the imaging pixel area is defined by pixels having different structures, high image quality can be achieved, in spite of miniaturization of pixels, by preventing image quality from being reduced by combinations of color filters of the same color and pixels having different structures.

What is claimed is:

1. A solid-state imaging device comprising:
    a pixel imaging area including a two-dimensionally arranged pixel array, wherein the pixel array is comprised of a plurality of first individual pixel types and second individual pixel types, the first individual pixel and the second individual pixel types have different structural characteristics and being arranged in rows and columns such that the individual pixels in each row and the individual pixels in each column alternate between pixels of the first pixel type and pixels of the second pixel type, and wherein the plurality of first individual pixel types have a substantially similar first light receiving characteristic and the plurality of second individual pixel types have a substantially similar second light receiving characteristic that is different from the first light receiving characteristic;

pixel units being comprised of four individual pixels having two adjacent pixels from a first row and two adjacent pixels of a second row, the pixels in the second row being located immediately below the pixels in the first row of a given pixel unit such that the individual pixels of the pixel unit are arranged in a substantially 2×2 rectangle pattern;

the individual pixels of each pixel unit arranged across a first diagonal of the square pattern being of the first pixel type and the individual pixels of each pixel unit arranged across a second diagonal of the square pattern being of the second pixel type and wherein the individual pixels of each pixel unit located along the first diagonal each having a same first color filter type and the individual pixels of each pixel unit located along the second diagonal having a color filter which is different from each other and which is different from the first color filter type for the pixels along the first diagonal.

2. The solid-state imaging device of claim 1, wherein the individual pixels along the first diagonal each have a green color filter.

3. The solid-state imaging device of claim 1, wherein the individual pixels along the first diagonal each have a green color filter and the first diagonal extends from a lower left of the pixel unit to an upper right location of the pixel unit.

4. A solid-state imaging device comprising:
a pixel imaging area including a two-dimensionally arranged pixel array, wherein the pixel array is comprised of a plurality of first individual pixel types and second individual pixel types, the first individual pixel types and the second individual pixel types have different structural characteristics and being arranged in rows and columns such that the individual pixels in each row are of a same pixel type which alternates between pixels of the first pixel type and pixel of the second pixel type, and wherein the plurality of first individual pixel types have a substantially similar first light receiving characteristic and the plurality of second individual pixel types have a substantially similar second light receiving characteristic that is different from the first light receiving characteristic;

pixel units being comprised of four individual pixels having two adjacent pixels from a first row and a single individual pixel from a row above and a single individual pixel from a row below the row of the two adjacent pixels, wherein the two adjacent pixels of the first row are pixels of the first type and the individual pixels of the row above and the row below are of the second type; and further wherein the two adjacent pixels of the first row each have different color filters and the individual pixels of the row above and the row below each have a same color filter which is different from the color filters of the adjacent pixels from the first row.

5. A solid-state imaging device comprising:
a pixel imaging area including a two-dimensionally arranged pixel array, wherein the
pixel array is comprised of a plurality of first individual pixel types and second individual pixel types, the first individual pixel types and the second individual pixel types have different structural characteristics and being arranged in rows and columns such that the individual pixels in each row are of a same pixel type which alternates between pixels of the first pixel type and pixels of the second pixel type, and wherein the plurality of first individual pixel types have a substantially similar first light receiving characteristic and the plurality of second individual pixel types have a substantially similar second light receiving characteristic that is different from the first light receiving characteristic;

pixel units being comprised of four individual pixels having two adjacent pixels from a first column and a single individual pixel from a column to the left and a single individual pixel from a column to the right of the column of the two adjacent pixels, wherein the two adjacent pixels of the first column are pixels of the first type and the individual pixels of the column to the left and the column to the right are of the second type; and further wherein the two adjacent pixels of the first column each have different color filter and the individual pixels of column to the left and the column to the right each have a same color filter which is different from the color filters of the adjacent pixels from the first column.

* * * * *